United States Patent [19]

Newman et al.

[11] Patent Number: 4,733,749

[45] Date of Patent: Mar. 29, 1988

[54] HIGH OUTPUT LOUDSPEAKER FOR LOW FREQUENCY REPRODUCTION

[75] Inventors: Raymond J. Newman; David E. Carlson, both of Niles, Mich.

[73] Assignee: Electro-Voice, Inc., Buchanan, Mich.

[21] Appl. No.: 834,403

[22] Filed: Feb. 26, 1986

[51] Int. Cl.[4] .............................................. H05K 5/00

[52] U.S. Cl. ................................... 181/144; 181/147; 181/150; 181/152; 181/155; 181/199

[58] Field of Search ............... 181/144, 147, 150, 152, 181/155, 199

[56] References Cited

U.S. PATENT DOCUMENTS

| | | | |
|---|---|---|---|
| 3,898,384 | 8/1975 | Goeckel | 181/147 X |
| 4,391,346 | 7/1983 | Murakami et al. | 181/147 |
| 4,437,540 | 3/1984 | Murakami et al. | 181/147 |
| 4,629,029 | 12/1986 | Gunness | 181/144 |

*Primary Examiner*—Benjamin R. Fuller
*Attorney, Agent, or Firm*—Burmeister, York, Palmatier, Hamby & Jones

[57] ABSTRACT

A loudspeaker system for low frequencies has a manifold chamber into which oppositely mounted and aligned woofer units radiate sound. The chamber radiates the sound perpendicularly to the woofer axes, either directly into space or into a horn. An additional back woofer may radiate directly in the perpendicular direction.

15 Claims, 14 Drawing Figures

HIGH OUTPUT LOUDSPEAKER FOR LOW FREQUENCY REPRODUCTION

BACKGROUND OF THE INVENTION a. Field of the Invention

This invention relates to an arrangement of speakers for a low-frequency sound reproduction system particularly adopted for high power output. More particularly, the invention is directed to a manifold for coupling multiple low frequency loudspeakers, in a single sound-radiating enclosure.

b. Description of the Prior Art

Multiple loudspeakers are often used in sound applications requiring high acoustic power output (sound volume), such as in theaters or arenas, or for studio and stage monitoring, discotheques and the like. In many sound systems, several components, such as driver/-horn assemblies or cone/enclosure loudspeakers, are used for sound reproduction across the entire range of audible sound, with different devices covering the bass (low-frequency), midrange and high-frequency portions of the sound spectrum. Low-frequency speakers are customarily referred to as "woofers".

A particular sound application may require an especially high power output across the whole audio spectrum. With respect to the low-frequency range, this has been accomplished in the past, in general, by increasing the number of loudspeakers, because of the need to set large volumes of air in motion to create high acoustic power. In order to move large air volumes, the excursion of a moving diaphragm having a given cone area could be increased, but since acoustic distortion increases with increasing excursion once the linear limitation of the loudspeaker suspension is reached, the solution of using multiple loudspeakers is generally preferred.

Multiple loudspeakers are conventionally mounted on a front baffle board of a speaker housing or enclosure. The housing may be closed, or may be provided with one or more phase-inverting ports or ducts (as in a bass-reflex type enclosure). Acoustic coupling and addition occurs in such structures at frequencies where the wavelengths are sufficiently greater than the distances between the individual speakers or phase-inverting ports.

U.S. Pat. Nos. 4,391,346 and 4,437,540 issued to Murakami et al. respectively on July 5, 1983 and March 20, 1984, show another approach to combining the outputs of several speaker units. The individual speaker units are set in the walls of a cavity behind a front baffle board. The speaker units of Murakami et al. are arranged so that the sound-radiating axis of each speaker unit angularly converges on and is concentrated on a point of the central axis of the cavity, just behind the front baffle, toward which the speakers are generally aimed. While such an arrangement may improve midrange sound reproduction, low-end frequency reproduction is adversely affected, as the cavity behaves like a short acoustic horn having a rapid flare rate, such a horn being incapable of sustaining very low-frequency sounds.

This invention is directed to solving these drawbacks by providing a novel and unique loudspeaker manifolding system.

SUMMARY OF THE INVENTION

An object of the invention is to provide an improved maximum output speaker system for high-volume sound. A more specific object is to provide an efficient arrangement for summing the outputs of a number of individual low-frequency speakers for radiation from a single sound-radiating aperture.

Another object is to minimize destructive sound interference and maximize coupling between loudspeakers at low frequencies.

According to an emboidment of the invention, a loudspeaker enclosure having a special manifold chamber is provided. The sound-radiating axes of the individual speaker units are not aimed towards the chamber exit. Instead, pairs are aimed directly at or away from each other. This optimizes low frequency performance without peaking medium-pitch sound. The manifold chamber exit is smaller than the sum of the diaphragm areas of the individual speakers inside the chamber.

BRIEF DESCRIPTION OF THE DRAWINGS

Other objects, features and advantages of the invention mentioned in the above brief explanation will be more clearly understood when taken together with the detailed description below and the accompanying drawings, in which.

DETAILED DESCRIPTION OF THE PREFERRED EMBODIMENTS

Referring generally to the figures, different embodiments of a woofer manifold according to the present invention are illustrated. In each instance, the manifold is provided in a vented or ported enclosure or box, commonly referred to as a "bass-reflex" type enclosure. The general purpose and effect of such ports is well known to those skilled in the art. In each embodiment, it will be seen that at least one pair of woofers is mounted on opposed walls of a manifold chamber so that the axial radiating directions of the woofers are aimed either directly at or away from each other, and both are aimed perpendicular to the forward radiating direction of the box. The manifold exit, in each case, is smaller than the sum of the areas of the individual speaker diaphragms.

Figure 1:
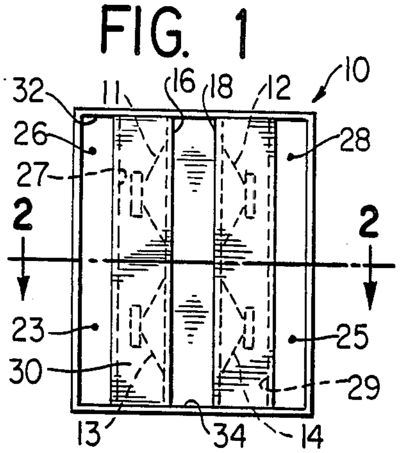
FIG. 1 is a front elevation view of a loudspeaker enclosure having a manifold chamber according to the invention.
Figure 2:
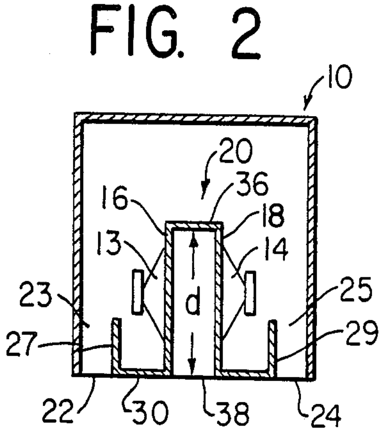
FIG. 2 is a cross-sectional view, looking down, of the enclosure of FIG. 1 viewed along line 2—2 thereof.

FIGS. 1 and 2 depict a low-frequency loudspeaker system having an outer enclosure or housing 10, a woofer manifold chamber or unit 20 according to aspects of the invention. Four woofer speakers 11, 12, 13, 14 are mounted on the side walls 16,18 of an internal manifold chamber 20, the woofers being arranged in opposed pairs 11,12 and 13,14. Visible from the front of the woofers are laterally disposed ports 22,24 which may be in the form of vertical, rectangular openings 26,28 at the left and right sides of a frontal baffle board 30. Many other port shapes are possible, including arrangements of rectangular or round holes located on the baffle board. The ports may be triangular in shape at the corners of the front baffle plate. The ports need not be located at the extreme lateral portions of the baffle board, but may be positioned in any suitable direction, such as forward-facing, and may be in a position to provide maximum airflow over the speaker magnets, thus providing maximum cooling during high-power operation, in addition to their usual acoustic phasing function. Each port 22,24 may be formed as a channel 23,25 by inwardly extending shields or baffles 27,29.

In the embodiment of FIG. 1, the manifold chamber 20 is a centrally located, generally flat, rectangular inner "box" 20 within the main loudspeaker enclosure 10. The top and bottom walls 32,34 of the chamber 20 may also be the top and bottom walls of the main enclosure 10 or may be independent panels. The front of the chamber 20 is open at 38 in the plane of the frontal baffle board 30. The opposite narrow wall 36 forms the rear wall of the manifold chamber 20 and is spaced back from the baffle board 30 a predetermined distance (d), less than or equal to the depth of the main loudspeaker enclosure 10.

The manifold chamber opening, or slot, 38 has a total frontal area (h×w) which is less than the sum of the individual woofer diaphragm areas. The preferred maximally flat frequency response is obtained when the slot area (h×w) is approximately one-half the total diaphragm radiating area. Increasing the slot area generally causes the response of the loudspeaker to vary toward the response of a loudspeaker with conventional front-facing woofers. It is preferable to minimize the slot width in order to keep the main box volume loss to a minimum. However, reducing the slot width may restrict acoustic transmission through the manifold and additionally induce standing waves within the manifold chamber.

Figure 3:
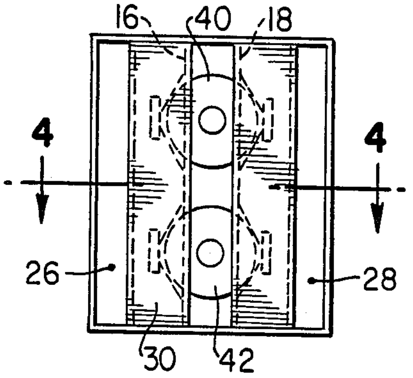
FIG. 3 is a front elevation view of another loudspeaker enclosure having a manifold chamber according to the invention.
Figure 4:
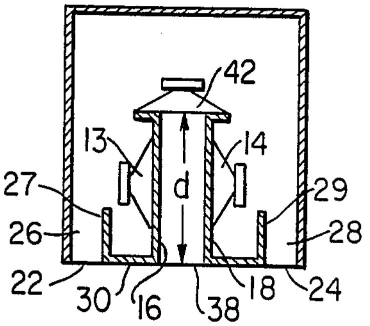
FIG. 4 is a cross-sectional view, looking down, of the enclosure of FIG. 3 viewed along line 4—4 thereof.

FIG. 3 shows a modified form of the loudspeaker system of FIG. 1, incorporating the present invention. In this form, two additional woofer speakers 40,42 are mounted on the rear wall 36 of the manifold chamber, increasing the number of woofer speakers in the single enclosure to six.

In the embodiments of FIGS. 1 and 3, the manifold chamber 20 radiates sound outwardly through its open frontal slot 38 into free air, this being a preferred construction. It may be desirable, in certain circumstances, however, for the manifold chamber to radiate into the throat of a horn, as is shown in cross-sectional views of FIGS. 5 and 6, respectively, corresponding to the plan view of the embodiments of FIGS. 1 and 3. In these variants, there is no need for a frontal baffle board. The manifold side walls 16,18 may be extended to form or joined to a wave guide or horn structure 44. The ports 26,28 may be provided by slots along the forward lateral edges of the horn structure 44, as shown. The horn 44 should have an appropriate low-frequency flare rate to sustain sounds in the desired frequency range, and to provide the desired angular distribution and directivity of sound.

Figure 7:
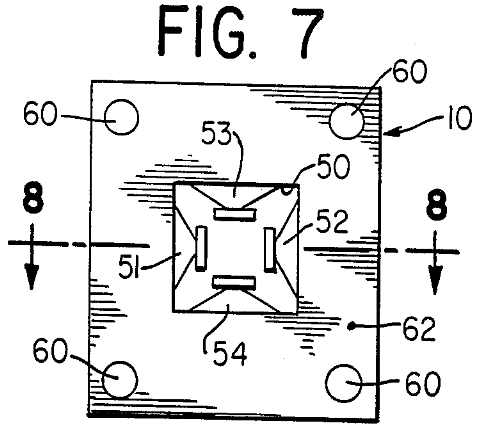
FIGS. 7 and 8 are front elevation and cross-sectional plan views of another loudspeaker enclosure having a manifold chamber that may be permanent or removable according to the invention.
Figure 8:
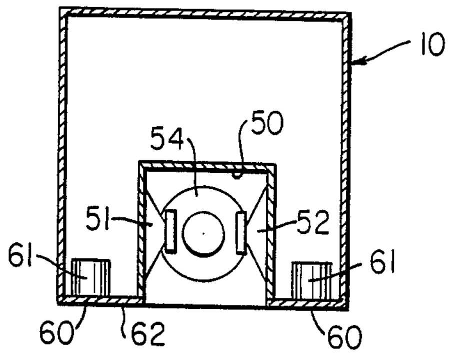

FIGS. 7 and 8 show respective front elevation and plan cross-section views of a further modification, in which the manifold chamber does not extend from bottom to top of the speaker enclosure 10, but instead can be formed as a separate module 50 which may be inserted into the main enclosure 10, thus permitting a variety of modules to be used with the same enclosure 10. The manifold module 50 has a first pair of speakers 51,52 in opposite side walls of the module, and further speakers 53,54 in the top and bottom walls of the manifold chamber 50. Where less power output is needed, one pair of these speakers may be omitted. The back wall 56 of the manifold module is a solid unapertured wall 54 in this form. The module 50 has a front opening 58. Ports 60 are provided distributed around the module chamber 50, illustratively in the corners of the front enclosure baffle 62. The ports 60 may be of circular shape as illustrated, or of other shapes, such as corner triangles. It will be understood that the total area of the ports is related to the volume of the main enclosure 10 surrounding the manifold chamber 50, in accordance with the general principles of bass reflex speaker enclosures. The ports 60 may be simply openings in the front baffle 62, or may have cylindrical or flaring shields 64 between the interior space of the main enclosure 10 and the ports 60.

In this instance, the speakers are shown as directed outwardly of the manifold module 50, which offers a convenience in that the manifold module and its speakers may form a separate sub-assembly to be inserted into the main enclosure 10 through the front opening of the baffle board 62. However, the speakers may also be directed inwardly into the manifold chamber 50 where desired. It will be understood that the speakers in any of the forms of the present invention may also be directed outwardly from the manifold chamber instead of inwardly as shown in FIGS. 1 to 6. However, it is desirable that all the speakers be made to radiate in phase.

Thus, a highly compact manifold module is provided which is essentially a box with the speakers mounted thereon, either inside facing outwardly through the box walls or outside, facing inwardly. The box then is installed in a large vented loudspeaker enclosure 10, at its front face.

Figure 9:
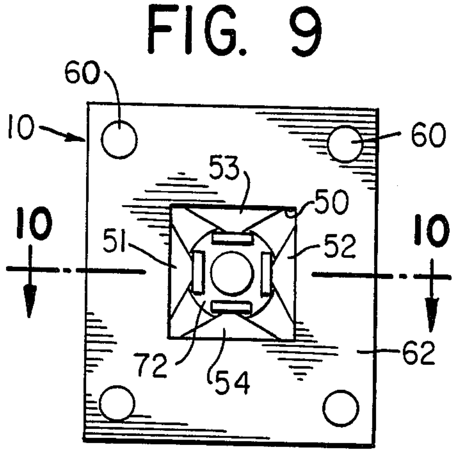
FIGS. 9 and 10 are front elevation and cross-sectional plan views of a modified form of the loudspeaker enclosure of FIGS. 7 and 8.
Figure 10:
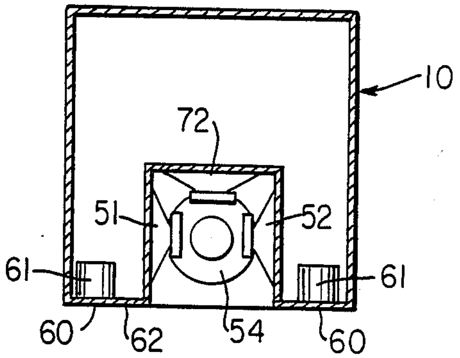

FIGS. 9 and 10 show a further modification, being the same as described with respect to FIGS. 7 and 8, with the addition of a further speaker 72 mounted on the rear wall of the manifold chamber 60, either inside or outside the chamber 50.

Figure 5:
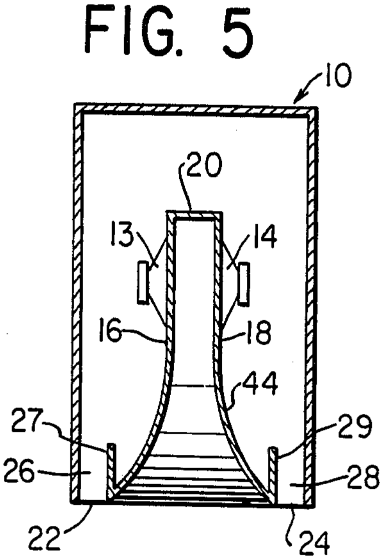
FIGS. 5 and 6 are cross-sectional plan views, through the manifold chamber of the embodiments illustrated respectively in FIGS. 1 and 3, modified so as to include an acoustic horn.
Figure 6:
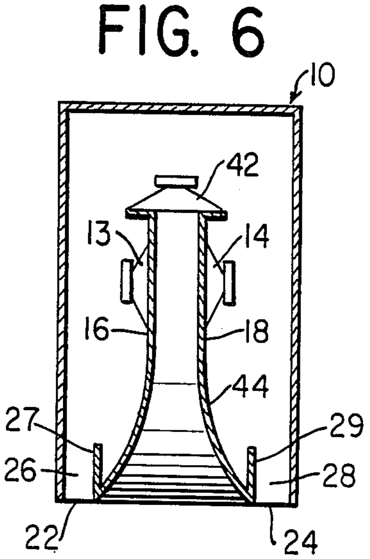
Figure 11:
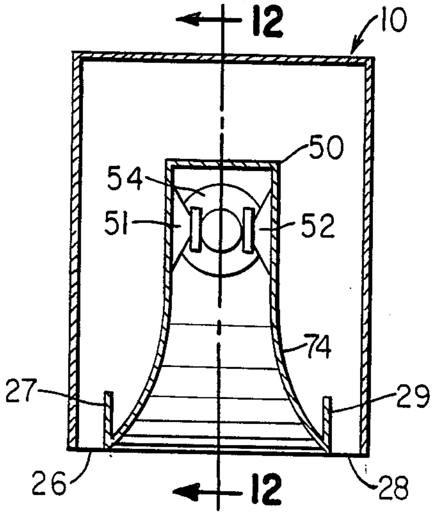
FIGS. 11 and 13 are cross-sectional plan views of the respective embodiments of FIGS. 7 and 9, modified so as to include an acoustic horn.
Figure 12:
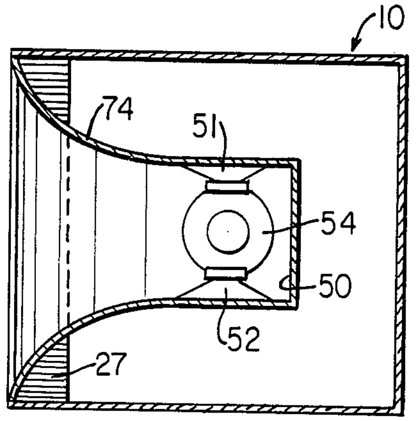
FIGS. 12 and 14 are elevation cross-sectional views of FIGS. 11 and 13, taken along lines 12—12 and 14—14 thereof.

FIGS. 11 and 12 illustrate the manifold module construction of FIG. 7, applied to an enclosure 10 having a horn 74 extending from the manifold chamber similar to horn 44 of FIGS. 5 and 6. In this instance, the ports 26,28 may be slots at the front face of the enclosure 10 similar to those of FIGS. 5 and 6, or may be discrete openings as in the case of the embodiment of FIGS. 7 or 9. It will be understood that the horn of FIG. 11 may be flaring either or both horizontally and vertically, for coupling the front opening of the manifold chamber 50 to the ambient space at the front of the entire loudspeaker system enclosure.

Figure 13:
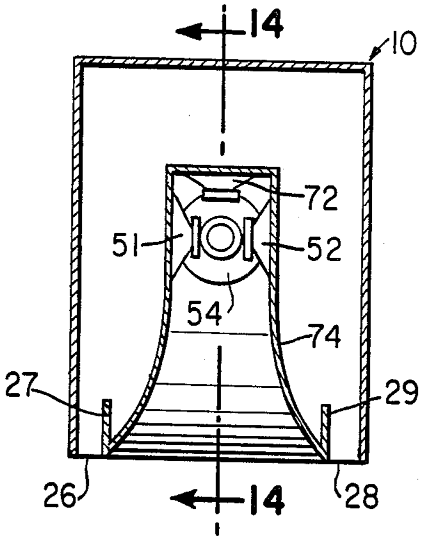
Figure 14:
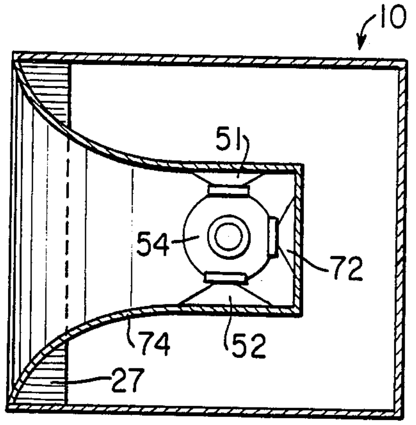

FIGS. 13 and 14 similarly illustrate the manifold module 60 of FIGS. 9 and 10 communicating into a horn 74 similar to the embodiment of FIGS. 11 and 12.

In any of the figures, the direction of radiation from the front of the cone of the speaker units may be into or out of the manifold chamber, but it is desirable that the speakers shall all radiate in phase.

Thus, in FIGS. 7-14, instead of a manifold chamber integral with the outer enclosure 10, communicating outwardly through a "slit" arrangement, as in FIGS. 1-6, a highly compact manifold module can be constructed which is essentially a box with speaker units mounted on it, facing outwardly or inwardly through the box walls. The box may be installed, at its front face, into the front or baffled panel of a large vented loudspeaker enclosure. This arrangement permits interchanging modules of different numbers or sizes of speaker with the same enclosure, as required for different acoustic power outputs.

It will be understood that the walls of the manifold chamber as well as the walls of the loudspeaker enclosure will be made of rigid material such as wood boards or panels (e.g. plywood or wood-chip panels).

A loudspeaker constructed in accordance with the principles of the invention as just described provides a number of unexpected and significant benefits and advantages. Primarily, the loudspeaker has increased low-frequency efficiency just above the enclosure tuned frequency, resulting in more low-frequency output for a given enclosure volume, or less enclosure volume required to achieve a given low-end frequency response. This is due to the increase in mass loading on the diaphragms provided by the present arrangement. A lower low-end cutoff is attained than with normal forward-facing speakers, and reduced distortion is attained for a given output.

Physically, a smaller frontal baffle board area can be used for a given number of woofer speakers, reducing the frontal size of the box. This is especially useful in sound applications requiring very high sound levels, such as concerts, where stage space for loudspeakers may be limited. The reduced size of the baffle board reduces destructive interference between the individual speakers within the manifold, and also between several woofer manifold enclosures.

Furthermore, the individual speaker diaphragms and cones are afforded an added measure of physical protection from accident or abuse, since they are not exposed on any outer side of the loudspeaker enclosure.

The intended working acoustic range for the speaker system of the invention is primarily frequencies below 200-300 hertz. The upper limit is determined by the point where serious degeneration in frequency response may occur due to the differences in path lengths from the various loudspeakers. At frequencies below about 150 Hz, the woofer manifolding technique of this invention substantially reduces harmonic distortion and power compression effects over comparable direct-radiating designs. The manifold also attenuates mid-range and higher frequencies produced by the woofers, thus reducing audible distortion generated by the driving amplifer.

It will be understood that the embodiments described herein are illustrative of a number of applications of the present invention, which is defined solely by the accompanying claims.

What is claimed as the invention is:

1. A loudspeaker system comprising:
a speaker enclosure having an opening in a front wall,
a speaker manifold mounted within said enclosure and communicating with said opening,
said manifold comprising a pair of substantially parallel side walls, a back wall, and top and bottom walls, defining a manifold chamber, the wall opposite said back wall being substantially open to define a manifold opening and to permit said communicating, said manifold opening being substantially in alignment with said front wall opening, and
a pair of speaker units, each mounted in a respective one of said side walls, said speaker units being connected to produce sound waves in phase, said speaker units also having axial sound directions substantially in alignment within said manifold chamber, whereby the sound outputs from said units combine and produce improved low-frequency response in the combined sound exiting from said enclosure opening.

2. A system as in claim 1 wherein said axial directions are substantially perpendicular to the frontal direction of said system.

3. A system as in claim 1 further including an additional speaker mounted on said back wall, with a sound direction axis intersecting those of said first speaker units.

4. A speaker system as in claim 1 further including a second pair of speaker units mounted respectively on said side walls with sound direction axes extending perpendicularly to said side walls and substantially in alignment.

5. A system as in claim 1 also including additional openings in said enclosure serving as sound ports.

6. A system as in claim 4 where each of said first and second pairs of speaker units are horizontally aligned and said second pair of speaker units are vertically aligned with said first-mentioned speaker units.

7. A system as in claim 5 wherein said ports are in the form of longitudinal slots, each at a side edge of said one enclosure wall.

8. A system as in claim 5 wherein said ports are triangular openings at corners of said one enclosure wall.

9. A system as in claim 1 wherein said manifold side walls, back wall and top and bottom walls are spaced from the walls of said enclosure to form a manifold module.

10. A system as in claim 3 wherein said manifold side walls, back wall and top and bottom walls are spaced from the walls of said enclosure to form a manifold module.

11. A system as in claim 4 wherein said manifold side walls, back wall and top and bottom walls are spaced from the walls of said enclosure.

12. A system as in claim 1 including an acoustic horn coupling said manifold with said speaker wall opening.

13. A system as in claim 3 including an acoustic horn coupling said manifold with said speaker wall opening.

14. A system as in claim 1 wherein said speakers produce sound in phase.

15. A system as in claim 1 wherein the area of said enclosure opening is approximately one-half the aggregate area of the sound-radiating diaphragms of said speakers.

* * * * *